United States Patent
Yamashita

(10) Patent No.: US 8,377,254 B2
(45) Date of Patent: Feb. 19, 2013

(54) PLASMA PROCESSING APPARATUS

(75) Inventor: Jun Yamashita, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 1196 days.

(21) Appl. No.: 11/916,179

(22) PCT Filed: May 29, 2006

(86) PCT No.: PCT/JP2006/310644
§ 371 (c)(1),
(2), (4) Date: Nov. 30, 2007

(87) PCT Pub. No.: WO2006/129591
PCT Pub. Date: Dec. 7, 2006

(65) Prior Publication Data
US 2010/0012275 A1  Jan. 21, 2010

(30) Foreign Application Priority Data
May 30, 2005 (JP) ................................ 2005-157840

(51) Int. Cl.
C23C 16/00 (2006.01)
C23F 1/00 (2006.01)
H01L 21/306 (2006.01)

(52) U.S. Cl. .......... 156/345.41; 118/723 MW; 118/715; 156/345.33; 156/345.34

(58) Field of Classification Search .......... 118/723 MW, 118/715; 156/345.41, 345.33, 345.34
See application file for complete search history.

(56) References Cited

U.S. PATENT DOCUMENTS

| | | | |
|---|---|---|---|
| 5,134,965 A * | 8/1992 | Tokuda et al. | 118/723 MW |
| 5,653,808 A * | 8/1997 | MacLeish et al. | 118/715 |
| 6,059,922 A * | 5/2000 | Yamazaki et al. | 156/345.37 |
| 7,166,170 B2 * | 1/2007 | Fink | 118/733 |
| 2004/0026038 A1 * | 2/2004 | Yoshida | 156/345.33 |

FOREIGN PATENT DOCUMENTS

| | | |
|---|---|---|
| JP | 10-134995 | 5/1998 |
| JP | 11-40397 | 2/1999 |
| JP | 2000-164570 | 6/2000 |
| JP | 2001-57361 | 2/2001 |
| KR | 2001-0112324 | 12/2001 |
| WO | 98-33362 | 7/1998 |
| WO | WO 02/093605 | * 11/2002 |

* cited by examiner

*Primary Examiner* — Rakesh Dhingra
(74) *Attorney, Agent, or Firm* — Oblon, Spivak, McClelland, Maier & Neustadt, L.L.P.

(57) ABSTRACT

A plasma processing apparatus including an essentially cylindrical chamber, which is airtight and grounded. The antenna unit is disposed on top of the chamber. The chamber has a divisible structure formed of an essentially cylindrical housing and a cylindrical chamber wall connected to the housing from above and surrounding a process space. The chamber wall is detachable.

6 Claims, 10 Drawing Sheets

PLASMA PROCESSING APPARATUS

TECHNICAL FIELD

The present invention relates to a plasma processing apparatus, and more specifically to a plasma processing apparatus for processing a target object, such as a semiconductor substrate, by use of plasma.

BACKGROUND ART

As a plasma processing apparatus, there is known a plasma processing apparatus of the RLSA (Radial Line Slot Antenna) type in which microwaves are supplied from a radial line slot antenna into a process chamber to generate plasma (for example, Patent Document 1). A plasma processing apparatus of the RLSA type includes a cylindrical container provided with a worktable disposed therein to place a target object thereon, and an antenna unit comprising a slot plate and a waveguide dielectric body to radiate microwaves. The antenna unit is disposed on top of the cylindrical container with a seal member interposed therebetween to seal the interface, thereby making a vacuum chamber.
[Patent Document 1]
WO 98/33362 (for example, FIG. 1 and so forth)

DISCLOSURE OF INVENTION

In order to realize an optimum process in a plasma processing apparatus of the RLSA type, it is necessary to adjust the antenna size in accordance with the size of a target object or semiconductor wafer (which may be simply referred to as "wafer"), or to adjust the antenna size and/or the distance (gap) between the wafer and antenna in accordance with the objective process content.

For example, in recent years, although the size of wafers tends to be larger, wafers of 6- to 12-inch sizes coexist in the current situation, and thus wafers of different sizes may require the same process to be performed thereon. Further, along with an increase in the integration degree and miniaturization level of semiconductor devices, process conditions have become complicate and thus entailed adjustment of the gap and so forth in accordance with the process content. In recent years, not only semiconductor wafers, but also glass substrates for manufacturing flat panel display (FPD) devices tend to be larger.

However, in the plasma processing apparatus of the RLSA type according to Patent Document 1 described above, the container and antenna are fixedly combined to constitute the plasma processing apparatus, and do not allow the antenna size and gap to be adjusted. Accordingly, in practice, different plasma processing apparatuses need to be prepared for a process in accordance with the wafer diameter and/or process content. As described above, conventional plasma processing apparatuses have poor flexibility in adjustment of the antenna size and the gap.

Accordingly, an object of the present invention is to provide a plasma processing apparatus that allows the antenna size and the gap to be easily adjusted.

In order to achieve the object described above, according to a first aspect of the present invention, there is provided a plasma processing apparatus comprising:

a process container configured to be vacuum-exhausted;

a worktable configured to place a target object thereon inside the process container; and a lid connected to an upper side of the process container to airtightly seal the process container, wherein the process container comprises a first housing surrounding the worktable and a second housing detachably interposed between the first housing and the lid.

According to a second aspect of the present invention, there is provided a plasma processing apparatus comprising:

a process container configured to be vacuum-exhausted;

a worktable configured to place a target object thereon inside the process container;

an electromagnetic wave supply device connected to an upper side of the process container and configured to supply electromagnetic waves into the process container; and a gas feed system configured to supply a plasma exciting gas into the process container, wherein the process container comprises a first housing surrounding the worktable and a second housing detachably interposed between the first housing and the electromagnetic wave supply device.

In the second aspect, the second housing disposed in position may have been selected from a plurality of cylindrical members having different heights and/or inner diameters prepared in advance, in accordance with a size of the target object. Alternatively, the second housing disposed in position may have been selected from a plurality of cylindrical members having different heights and/or inner diameters prepared in advance, in accordance with a content of a plasma process. The electromagnetic wave supply device disposed in position preferably has a size selected in accordance with a size of the target object.

In the second aspect, the gas feed system may comprise a plurality of gas feed portions disposed at positions in the second housing. In this case, the gas feed portions preferably comprise gas inlets opened to a space inside the process container, and gas feed passages connected to the gas inlets, and the gas feed passages are connected to gas distribution means formed at a contacting portion between an upper end of the first housing and a lower end of the second housing to uniformly distribute a gas to the gas feed portions. In this case, the gas distribution means may be a gap defined between a step portion formed on the upper end of the first housing and a step portion formed on the lower end of the second housing.

In the second aspect, the electromagnetic waves may be microwaves, and the electromagnetic wave supply device may comprise an antenna configured to supply microwaves. The antenna may be a planar antenna having a plurality of slot holes formed therein.

According to a third aspect of the present invention, there is provided a plasma processing apparatus comprising:

a process container configured to be vacuum-exhausted;

a worktable configured to place a target object thereon inside the process container;

a lid connected to an upper side of the process container to airtightly seal the process container; and a first housing surrounding the worktable, wherein the first housing and the lid are capable of being connected to each other through a second housing, and further capable of being directly connected to each other without the second housing.

According to the present invention, a process container for performing a plasma process on a target object comprises a second housing detachably interposed between a first housing and a lid (or an electromagnetic wave supply device). The second housing can be replaced with an alternative second housing having a different shape, so that the type and/or size of the gap and/or the lid (or the electromagnetic wave supply device) can be adjusted in accordance with the size of the target object or semiconductor wafer and/or the process object.

In this case, due to a change in the size of the target object and/or the process object, the plasma processing apparatus does not require replacement as a whole, but requires only replacement of the second housing and/or the lid (or the electromagnetic wave supply device).

Consequently, the developing steps and material cost of the plasma processing apparatus can be saved. Further, a version upgrade and a renovation for a new application can be easily performed after the installation of the apparatus. Further, the number of parts to be replaced due to a renovation and/or failure is decreased, so the maintenance cost is decreased.

BEST MODE FOR CARRYING OUT THE INVENTION

Embodiments of the present invention will now be described with reference to the accompanying drawings.

Figure 1:
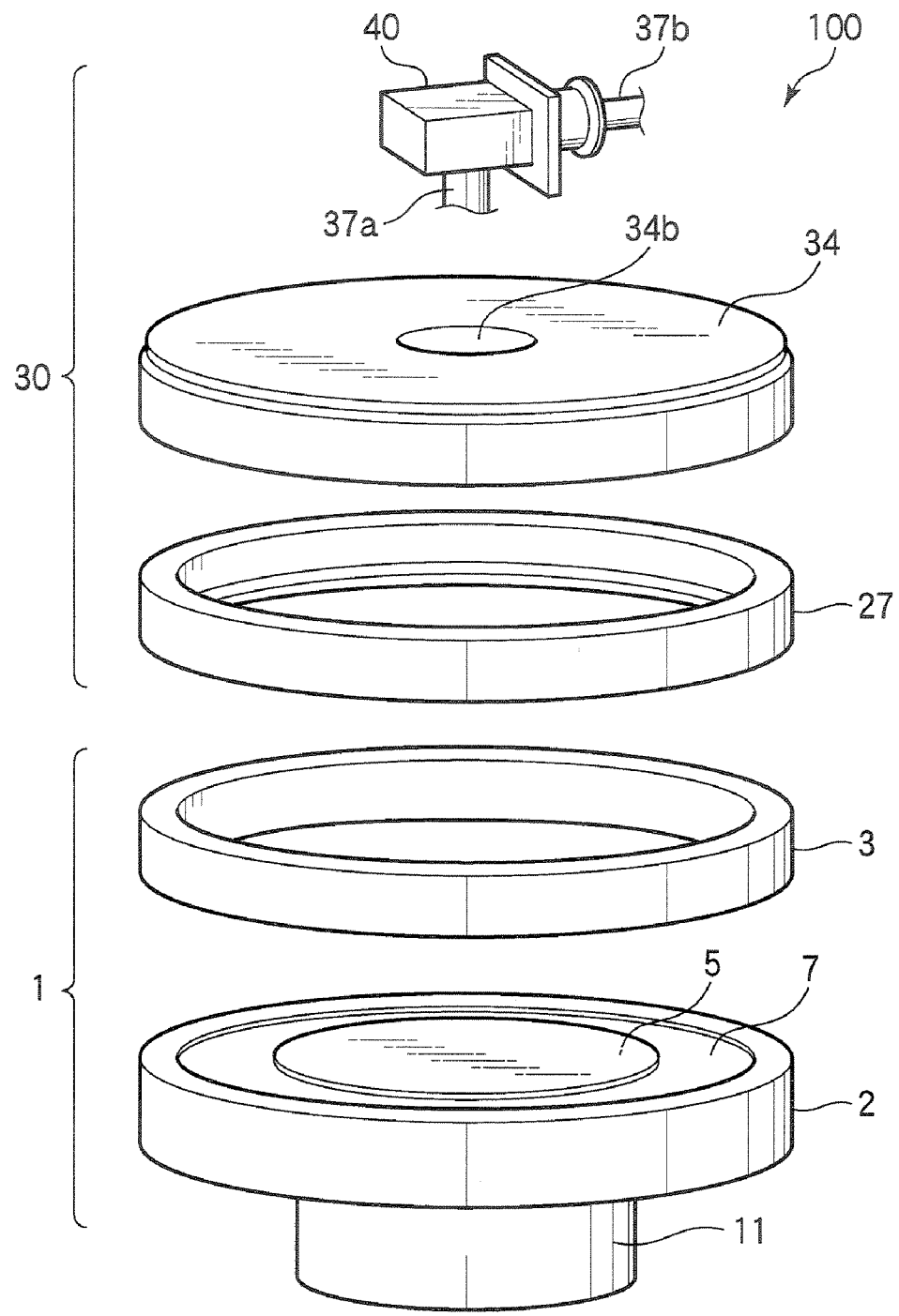
FIG. 1 This is an exploded perspective view schematically showing the structure of a plasma processing apparatus according to an embodiment of the present invention.
Figure 2:
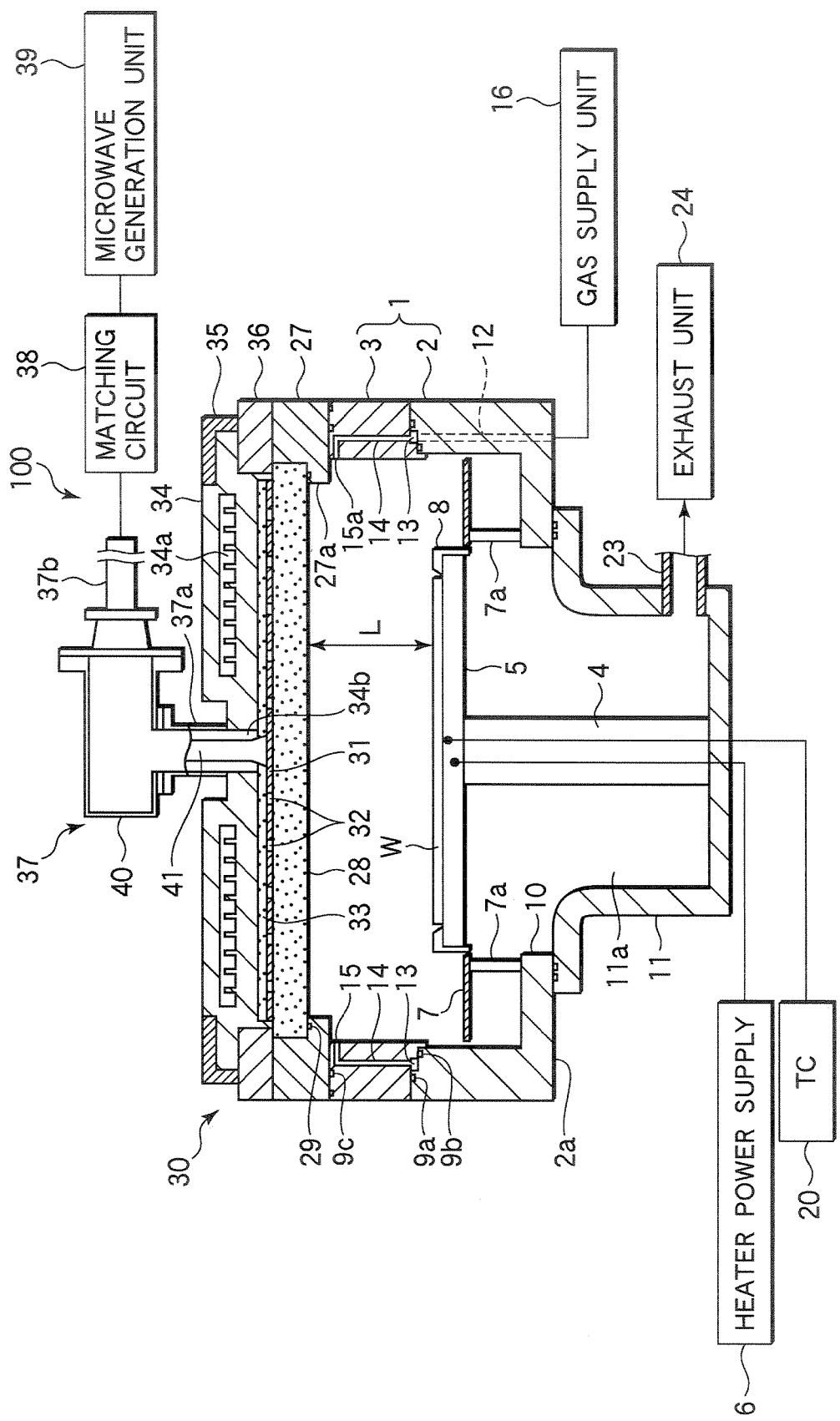
FIG. 2 This is a sectional view schematically showing the plasma processing apparatus.

FIG. 1 is an exploded perspective view schematically showing the structure of a plasma processing apparatus 100 according to an embodiment of the present invention. FIG. 2 is a sectional view schematically showing the plasma processing apparatus 100. This plasma processing apparatus 100 is arranged as a plasma processing apparatus, in which microwaves are supplied from a planar antenna having a plurality of slots, such as RLSA (Radial Line Slot Antenna), into a process chamber to generate microwave plasma with a high density and a low electron temperature.

The plasma processing apparatus 100 includes an airtight chamber 1 for accommodating a wafer W, wherein the chamber 1 has an essentially cylindrical shape and is grounded. The chamber 1 may be formed of a rectangular column with a rectangular cross section. The chamber 1 comprises an essentially cylindrical housing 2 (chamber base) defined as a "first housing", and a cylindrical chamber wall 3 (detachable part) defined as a "second housing" connected to the housing 2 from above and surrounding the process space. The chamber 1 is provided with an antenna unit 30 on the top, which serves as an "electromagnetic wave supply device" for supplying electromagnetic waves, such as microwaves, into the process space.

The bottom wall 2a of the housing member 2 has a circular opening portion 10 formed essentially at the center. The bottom wall 2a is provided with an exhaust chamber 11 communicating with the opening portion 10 and extending downward to uniformly exhaust the interior of the chamber 1.

A worktable (susceptor) 5 is disposed inside the housing 2 to support a target substrate, such as a wafer W, in a horizontal state. The susceptor 5 is made of a material, such as quartz or ceramic (AlN, Al$_2$O$_3$, etc.), and is supported by the bottom of the exhaust chamber 11. The susceptor 5 is supported by a cylindrical support member 4 extending upward from the center of the bottom of the exhaust chamber 11. The support member 4 and susceptor 5 may be made of a ceramic material with a high thermal conductivity, such as AlN. The susceptor 5 is provided with a guide ring 8 disposed on the outer edge to guide the wafer W. The susceptor 5 is further provided with a heater (not shown) of the resistance heating type built therein. The heater is supplied with a power from a heater power supply 6 to heat the susceptor 5, thereby heating the target object or wafer W. The temperature of the susceptor 5 is measured by a thermo couple (TC) 20, so that the temperature can be controlled within a range of, e.g., from room temperature to 1,000° C. The susceptor 5 may be provided with an electrostatic chuck to electrically hold and release the wafer W.

The susceptor 5 is provided with wafer support pins (not shown) that can project and retreat relative to the surface of the susceptor 5 to support the wafer W and move it up and down. The outer periphery of the susceptor 5 is surrounded by an annular baffle plate 7 supported by a plurality of support members 7a. The baffle plate 7 has a number of through holes (not shown) and allows the interior of the chamber 1 to be uniformly exhausted. A cylindrical liner (not shown) made of quartz is attached along the inner wall of the chamber 1 to prevent metal contamination due to the material of the chamber, thereby maintaining a clean environment.

The sidewall of the exhaust chamber 11 is connected to an exhaust unit 24 including a high speed vacuum pump through an exhaust line 23. The exhaust unit 24 can be operated to uniformly exhaust the gas from inside the chamber 1 into the space 11a of the exhaust chamber 11, and then out of the exhaust chamber 11 through the exhaust line 23. Consequently, the inner pressure of the chamber 1 can be decreased at a high speed to a predetermined vacuum level, such as 0.133 Pa.

The housing 2 has a transfer port formed in the sidewall and provided with a gate valve for opening/closing the transfer port (they are not shown), so that the wafer W is transferred therethrough.

The sidewall of the chamber 1 has gas feed passages formed therein to supply a process gas into the chamber 1. Specifically, a step portion 18 is formed at the upper end of the sidewall of the housing 2, while a step portion 19 is formed at the lower end of the chamber wall 3. As described later, an annular passage 13 is formed between the step portions 18 and 19 (see FIG. 5A).

Figure 3A:
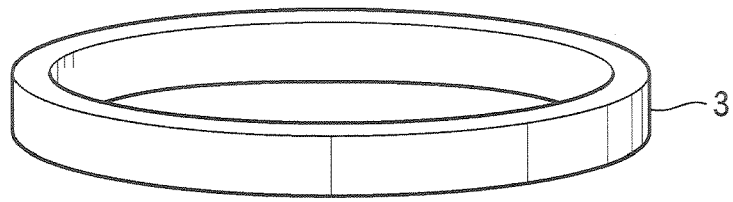
FIG. 3A This is a perspective view showing the external appearance of a chamber wall for an explanation thereof.
Figure 3B:
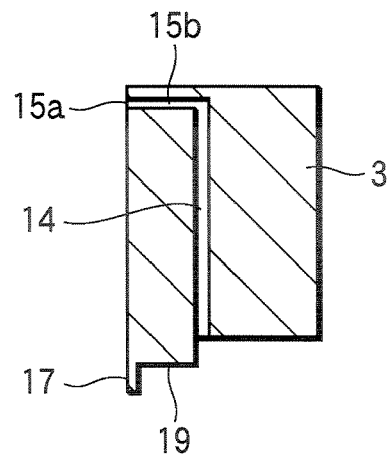
FIG. 3B This is a sectional view showing a main portion of the chamber wall for an explanation thereof.

The chamber wall 3 is a detachable member, which has an annular shape (or a rectangular column shape) as a whole, and is made of a metal material, such as aluminum or stainless steel. The upper end of the chamber wall 3 engages with the lower end of an upper plate 27 that is included in the antenna unit 30. In other words, the chamber wall 3 serves as an antenna unit support member for supporting the antenna unit 30. The lower end of the chamber wall 3 engages with the upper ends of the housing 2. FIGS. 3A and 3B schematically show the structure of the chamber wall 3. FIG. 3A is a perspective view showing the external appearance of the chamber wall 3, and FIG. 3B is a sectional view showing a main portion thereof. In this embodiment, the chamber wall 3 has an annular shape in accordance with the shape of the housing 2, and is provided with a gas flow passage comprising gas passages 14 and gas feed passages 15*b* formed therein.

The chamber wall 3 has an annular projecting portion 17 formed on the inner circumferential part at the lower end, which extends vertically downward like a skirt. The projecting portion 17 covers the contacting portion (interface) between the chamber wall 3 and housing 2 to prevent plasma from directly acting on a seal member 9*b*, such as an O-ring. The seal member 9*b* is made of a material that can be easily deteriorated by plasma damage due to plasma exposure, such as a fluorocarbon rubber material (for example, Chemraz (TM: Greene, Tweed & Co. Ltd.) and Viton (TM: DuPont Performance Elastomers LLC).

At the upper and lower interfaces of the chamber wall 3, seal members 9*a*, 9*b*, and 9*c*, such as O-rings are disposed to ensure that these interfaces are airtight. Further, the chamber wall 3 has the step portion 19 formed at the lower end, which is combined with the step portion 18 of the housing 2 to form the annular passage 13 (see FIG. 5A).

According to this embodiment, the chamber 1 is formed not as an integral structure, but as a divisible structure in which the housing 2 and chamber wall 3 can be separated from each other. This structure allows the chamber wall 3 to be replaced with an alternative one having a different height and/or diameter, as described later, so that high flexibility is provided in adjusting the gap L of the plasma processing apparatus 100 and/or the size of the planar antenna member 31 in accordance with the size of the wafer W. For example, even where conditions, such as the process gas flow rate, pressure, temperature, and/or microwave power, are changed, the process content can be set the same as that obtained before the change, by adjusting the gap L.

Figure 7A:
FIG. 7A This is a perspective view showing the external appearance of the chamber wall used in the state shown in FIG. 6.
Figure 9A:
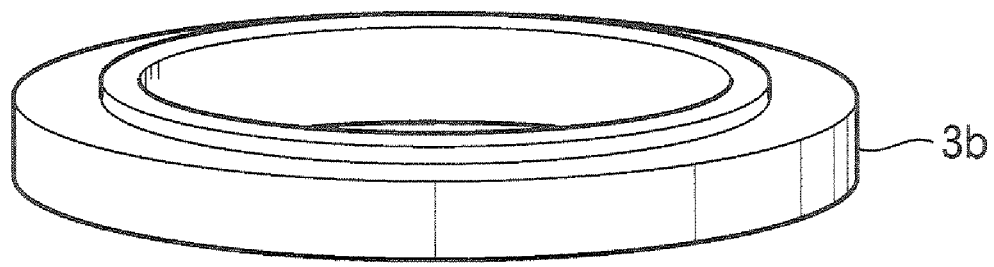
FIG. 9A This is a perspective view showing the external appearance of the chamber wall used in the state shown in FIG. 8.
Figure 11A:
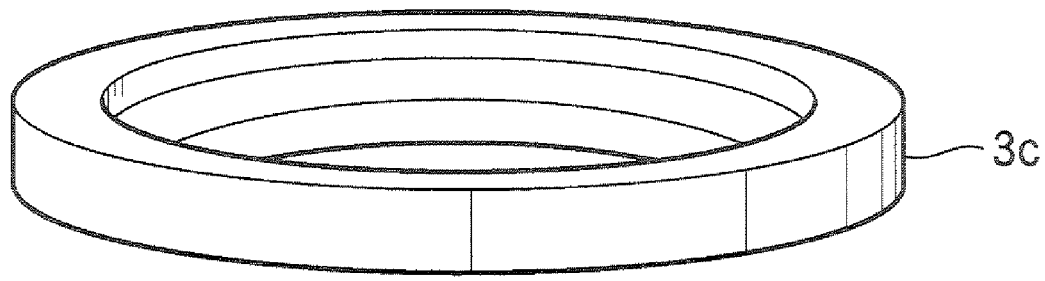
FIG. 11A This is a perspective view showing the external appearance of the chamber wall used in the state shown in FIG. 10.

For example, as regards variations of the chamber wall 3, chamber walls 3*a*, 3*b*, and 3*c* shown in FIGS. 7A, 9A, and 11A are prepared to replace the chamber wall 3. Each of the chamber walls 3*a*, 3*b*, and 3*c* has an essentially cylindrical shape, and is essentially the same in outer diameter, and different in height and inner diameter, as compared to the chamber wall 3. Each of the chamber walls 3*a*, 3*b*, and 3*c* serves as an antenna unit support member for supporting the antenna unit 30.

The housing 2 may be directly connected to the antenna unit 30 without the chamber wall 3 interposed therebetween.

The chamber 1 has an opening portion at the top, which is airtightly closed by the antenna unit 30. In other words, the antenna unit 30 serves as a lid as a whole for the chamber 1 that is opened upward. The upper plate 27 of the antenna unit 30 is brought into contact with and separated from the chamber wall 3, 3*a*, 3*b*, or 3*c*, so that it can also serve as a coupler for detachably connecting the lid (antenna unit 30) to the chamber 1.

The antenna unit 30 includes a transmission plate 28, a planar antenna member 31, and a wave-retardation body 33 laminated in this order from the susceptor 5 side. These members are covered with a shield member 34 made of a metal material, such as aluminum or stainless steel, a holding ring 36, and an upper plate 27, which are fixed by an annular holding ring 35. For example, the holding ring 35 has an L-shape in a cross section. The portion between the upper end of the chamber 1 and the upper plate 27 is sealed by the seal member 9*c*.

The transmission plate 28 is made of a dielectric material, such as quartz, $Al_2O_3$, AlN, sapphire, or a ceramic, e.g., SiN. The transmission plate 28 serves as a microwave introduction window for transmitting microwaves into the process space within the chamber 1. The bottom surface of the transmission plate 28 (on the susceptor 5 side) is not limited to a flat shape, and, for example, a recess or groove may be formed thereon to make microwaves uniform and thereby stabilize plasma. The transmission plate 28 is airtightly supported through a seal member 29 by an annular projecting portion 27*a* formed on the annular inner surface of the upper plate 27 below and around the antenna unit 30. Accordingly, the interior of the chamber 1 can be kept airtight.

The planar antenna member 31 is formed of a circular plate and is fixed to the annular inner surface of the shield lid 34 above the transmission plate 28. For example, the planar antenna member 31 is formed of, e.g., a copper plate or aluminum plate with the surface plated with gold or silver. The planar antenna member 31 has a number of slot holes 32 formed therethrough and arrayed in a predetermined pattern, for radiating electromagnetic waves, such as microwaves.

Figure 4:
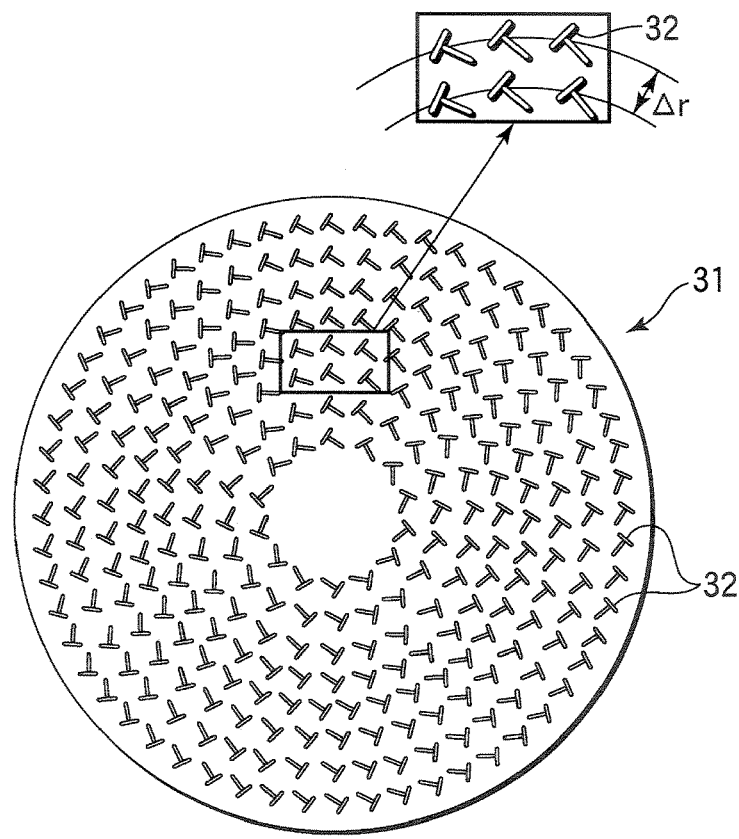
FIG. 4 This is a view showing the structure of a planar antenna member for an explanation thereof.

For example, as shown in FIG. 4, the slot holes 32 are formed of long slits. Typically, the slot holes 32 are arrayed on a plurality of concentric circles and arranged such that adjacent slot holes 32 form a T-shape. The length and array intervals of the slot holes 32 are determined in accordance with the wavelength ($\lambda g$) of microwaves. For example, the intervals of the slot holes 32 are set to be $\lambda g/2$ or $\lambda g$. In FIG. 4, the interval between adjacent slot holes 32 respectively on two concentric circles is expressed with $\Delta r$. The slot holes 32 may have another shape, such as through holes of a circular shape or arc shape. The array pattern of the slot holes 32 is not limited to a specific one, and, for example, it may be spiral or radial other than concentric. Further, the array pattern of the slot holes 32 may be linear.

The wave-retardation body 33 has a dielectric constant larger than that of vacuum, and is located on top of the planar antenna member 31. For example, the wave-retardation plate 33 is made of quartz, a ceramic, a fluorocarbon resin, e.g., polytetrafluoro-ethylene, or a polyimide resin. In a vacuum condition, the wavelength of microwaves becomes longer, and a standing wave is generated and microwaves are thereby less uniformly supplied into the process chamber. Accordingly, where the wave-retardation body 33 shortens the wavelength of microwaves, microwaves is uniformized to uniformly generate plasma. The planar antenna member 31 may be set in contact with or separated from the transmission plate 28. Similarly, the wave-retardation body 33 may be set in contact with or separated from the planar antenna member 31.

The shield lid 34 is provided with cooling water passages 34*a* formed therein. Cooling water is supplied to flow through the cooling water passages and thereby to cool the shield lid 34, wave-retardation body 33, planar antenna member 31, and transmission plate 28. The shield lid 34 is grounded.

The shield lid 34 has an opening portion 34b formed at the center of the upper wall and connected to a waveguide tube 37. The waveguide tube 37 is connected to a microwave generation unit 39 at one end through a matching circuit 38. The microwave generation unit 39 generates microwaves with a frequency of, e.g., 2.45 GHz, which are transmitted through the waveguide tube 37 to the planar antenna member 31. The microwaves may have a frequency of 8.35 GHz or 1.98 GHz.

The waveguide tube 37 includes a coaxial waveguide tube 37a having a circular cross-section and extending upward from the opening portion 34b of the shield lid 34, and a rectangular waveguide tube 37b connected to the upper end of the coaxial waveguide tube 37a through a mode transducer 40 and extending in a horizontal direction. Microwaves are propagated in a TE mode through the rectangular waveguide tube 37b, and are then changed into a TEM mode by the mode transducer 40 interposed between the rectangular waveguide tube 37b and coaxial waveguide tube 37a. The coaxial waveguide tube 37a includes an inner conductive body 41 extending at the center, which is connected and fixed to the center of the planar antenna member 31 at the lower end. Consequently, microwaves are efficiently propagated from the inner conductive body 41 of the coaxial waveguide tube 37a in the radial direction to the planar antenna member 31.

Figure 5A:
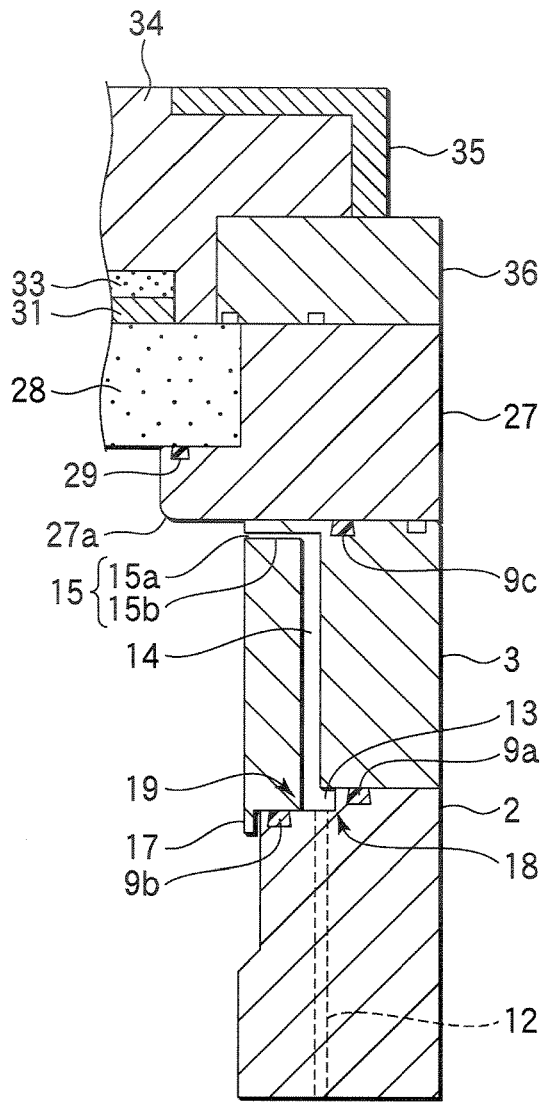
FIG. 5A This is a sectional view showing a structure near a gas inlet.

FIG. 5A is an enlarged view showing the structure of a gas feed root in the plasma processing apparatus 100 according to this embodiment. The chamber wall 3 includes a gas feed system 15 for supplying a gas into the chamber 1. The gas feed system 15 is formed of gas inlets 15a and gas feed passages 15b. The gas inlets 15a are uniformly formed along the inner surface of the sidewall of the chamber 1 at a plurality of positions (for example 32 positions). The gas inlets 15a are connected to the gas feed passages 15b extending from the inner surface in the horizontal direction. The gas feed passages 15b are connected to gas passages 14 extending in the vertical direction in the chamber wall 3. The gas inlets 15a and gas feed passages 15b may be formed in the upper plate 27.

The gas passages 14 are connected to the annular passage 13, which is formed of a gap between the step portions 18 and 19 at the interface between the upper end of the housing 2 and the lower end of the chamber wall 3. The annular passage 13 extends in an essentially horizontal annular direction to surround the process space. The annular passage 13 is connected to a gas supply unit 16 through passages 12 formed in the housing 2 at certain positions (for example, at 4 positions uniformly separated) and extending in the vertical direction. The annular passage 13 serves as gas distribution means for supplying a gas into the gas passages 14 in uniform distribution, thereby preventing the gas from being preferentially supplied into a specific one of the gas inlets 15a. The gas inlets 15a are uniformly located at, e.g., 8 to 32 positions to uniformly supply a process gas into the chamber 1 in accordance with a process content performed in the plasma processing apparatus 100.

According to the embodiment described above, a gas from the gas supply unit 16 is supplied through the passages 12, annular passage 13, and gas passages 14, and is uniformly delivered from the gas inlets 15a at 32 positions into the chamber 1. Consequently, the uniformity of plasma generated within the chamber 1 is improved, so that the wafer W is more uniformly processed. Further, the gas flow passage structure thus arranged can simplify facilities for supplying a gas, such as gas lines, thereby simplifying the structure of the apparatus as a whole.

The passages 12 are connected through the annular passage 13, which is used for distributing a gas in the horizontal direction, to the gas passages 14 formed in the chamber wall 3. Accordingly, the gas inlets 15a can be located at arbitrary positions on the inner surface of the chamber wall 3 to supply gas into the chamber 1.

In this case, various variations of the gas inlets 15a can be easily set in accordance with the process content. Specifically, there is a case where a gas should be supplied near the microwave feed position (in the vicinity of the transmission plate 28). By contrast, there is a case where gas dissociation proceeds too much and/or the interior of the gas inlets 15a may be damaged if a gas is supplied near the microwave feed position. In the later case, the gas inlets 15a should be located on a lower side.

Figure 5B:
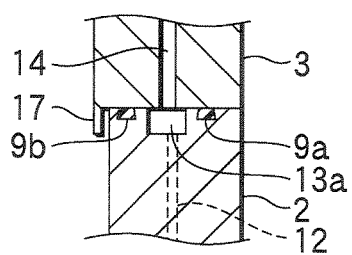
FIG. 5B This is a sectional view showing a main portion of an alternative structure near a gas inlet.
Figure 5C:
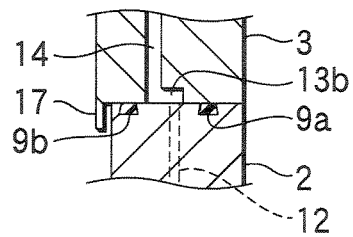
FIG. 5C This is a sectional view showing a main portion of another alternative structure near a gas inlet.

In FIG. 5A, the annular passage 13 is formed between the step portion 18 on the upper end of the housing 2 and the step portion 19 on the lower end of the chamber wall 3. However, for example, as shown in FIG. 5B, an annular groove may be formed in the upper surface of the housing 2 and combined with the flat lower surface of the chamber wall 3 to form an annular passage 13a. Further, for example, as shown in FIG. 5C, an annular groove may be formed in the lower surface of the chamber wall 3 and combined with the flat upper surface of the housing 2 to form an annular passage 13b. Further, although not shown, annular grooves may be formed in both of the housing 2 and chamber wall 3 and combined to face each other to form an annular passage.

Next, an explanation will be given of a plasma process performed on a target object or wafer W in the plasma processing apparatus 100 having the structure described above.

At first, the wafer W is loaded into the chamber 1 and placed on the susceptor 5. Then, process gases are supplied at predetermined flow rates from the gas supply unit 16 through the gas inlets 15a into the chamber 1. Examples of the process gases are a rare gas, such as Ar, Kr, or He, and an oxidizing gas, such as $O_2$, $N_2O$, NO, $NO_2$, or $CO_2$, or a nitriding gas, such as $N_2$ or $NH_3$. The process gases may be formed of other film formation gases or etching gases.

Then, microwaves are supplied from the microwave generation unit 39 through the matching circuit 38 into the waveguide tube 37. The microwaves are guided through the rectangular waveguide tube 37b, mode transducer 40, and coaxial waveguide tube 37a in this order, and are then propagated through the inner conductive body 41 to the planar antenna member 31. Then, the microwaves are radiated from the slots of the planar antenna member 31 through the transmission plate 28 into the chamber 1.

The microwaves are propagated in a TE mode through the rectangular waveguide tube 37b, and are then changed from the TE mode into a TEM mode by the mode transducer 40 and propagated in the TEM mode through the coaxial waveguide tube 37a to the planar antenna member 31. When the microwaves are radiated from the planar antenna member 31 through the transmission plate 28 into the chamber 1, an electromagnetic field is thereby formed inside the chamber 1 and turns the process gases into plasma.

Since microwaves are radiated from a number of slot holes 32 of the planar antenna member 31, this plasma has a high plasma density of about $1 \times 10^{10}$ to $5 \times 10^{12}/cm^3$ or more and a low electron temperature of about 1.5 eV or less near the wafer W. Accordingly, where this plasma acts on the wafer W, the process can be performed while suppressing plasma damage. The content of the plasma process is not limited to a specific one. For example, this plasma process may be one of various plasma processes, such as oxidation, nitridation, oxynitridation, film formation, and etching processes, performed on one of various substrates (such as a silicon substrate, an FPD glass substrate, and a compound semiconductor substrate).

Figure 6:
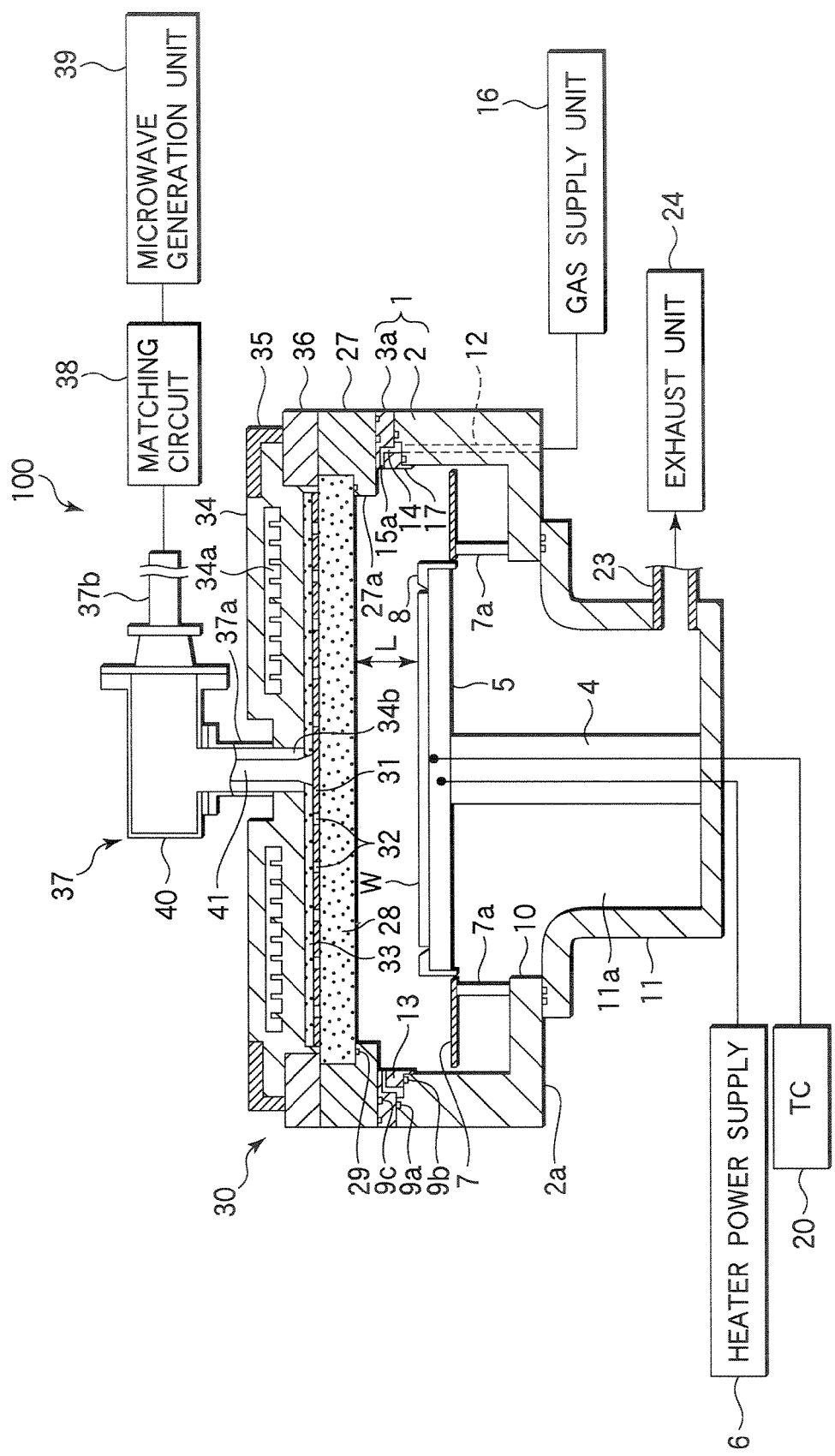
FIG. 6 This is a sectional view schematically showing the plasma processing apparatus provided with an alternative chamber wall.
Figure 8:
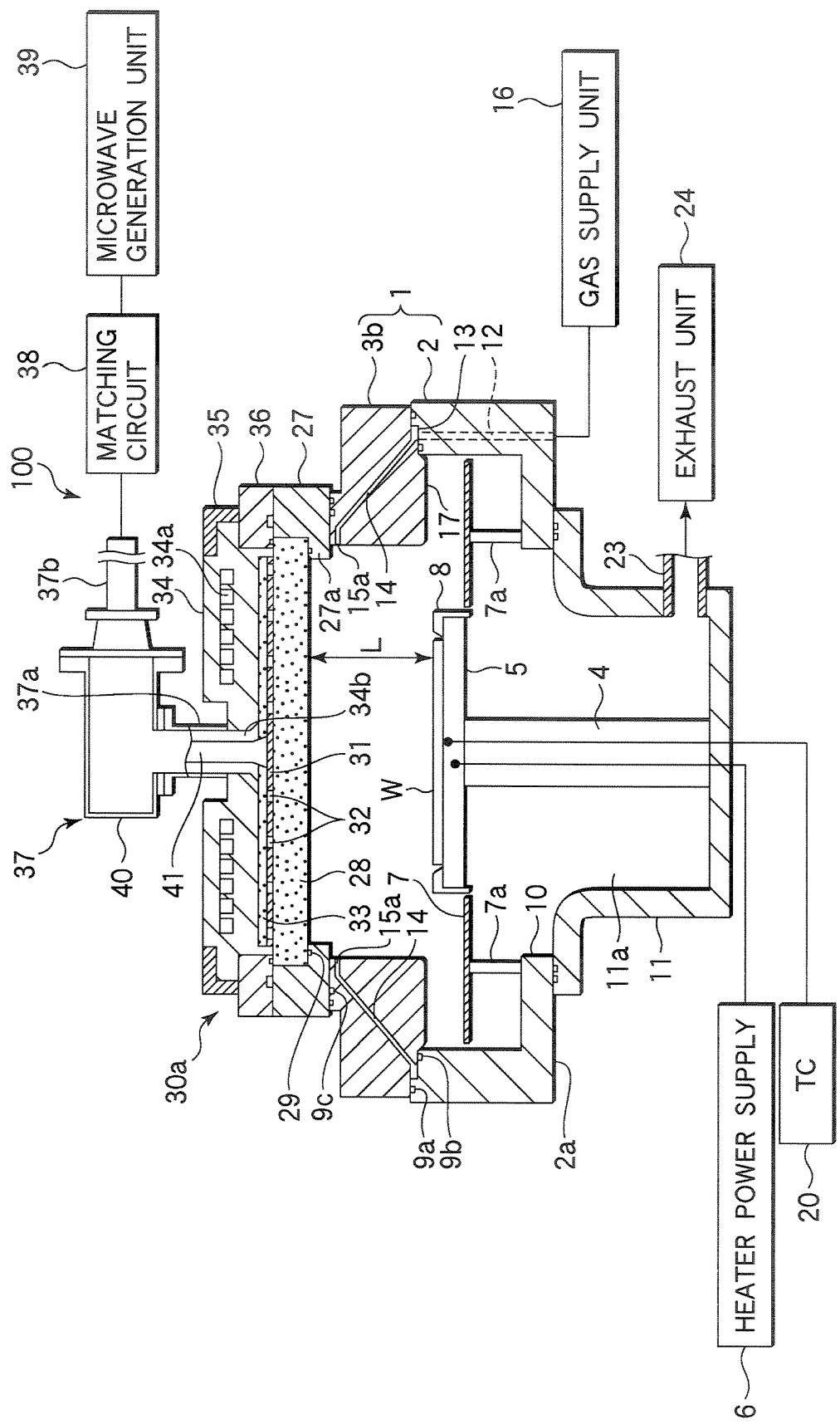
FIG. 8 This is a sectional view schematically showing the plasma processing apparatus provided with another alternative chamber wall.
Figure 10:
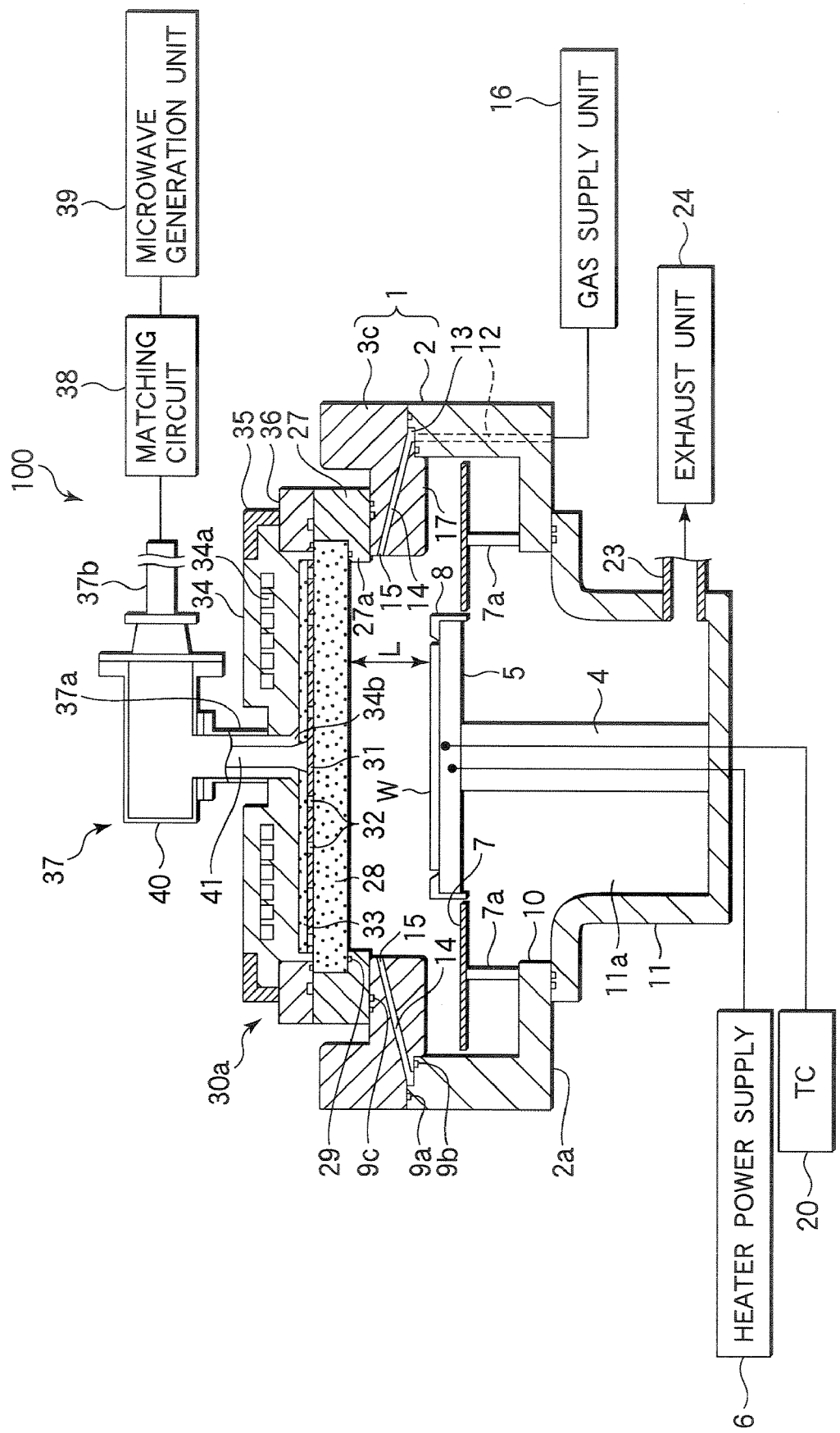
FIG. 10 This is a sectional view schematically showing the plasma processing apparatus provided with another alternative chamber wall.

Each of FIGS. 6, 8, and 10 is a view showing the plasma processing apparatus 100 provided with an alternative chamber wall in place of the chamber wall 3 shown in FIG. 1. In FIGS. 6, 8, and 10, the structure of the plasma processing apparatus 100 is essentially the same as that shown in FIGS. 1 and 2. Accordingly, the constituent elements having substantially the same arrangement are denoted by the same reference numerals, and a repetitive description thereof will be omitted.

Figure 7B:
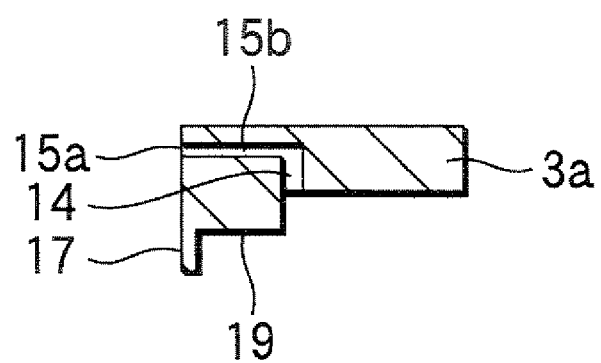
FIG. 7B This is a sectional view showing a main portion of the chamber wall used in the state shown in FIG. 6.

FIG. 6 shows another embodiment in which the chamber wall 3 of the plasma processing apparatus 100 shown in FIG. 1 is replaced with a chamber wall 3a having a lower height. FIG. 7A is a perspective view showing the external appearance of the chamber wall 3a, and FIG. 7B is a sectional view thereof. Where the chamber wall 3a having a lower height is used, the distance (gap L) becomes shorter between the wafer W and the bottom surface of the transmission plate 28 of the antenna unit 30, in the plasma processing apparatus 100. Since the gap L can be simply adjusted in accordance with the process object by replacing the chamber wall, a plasma process can be performed with an optimum gap L adjusted in accordance with the process content, such as process conditions.

The chamber wall 3a having a lower height is provided with gas inlets 15a connected to gas passages 14 through gas feed passages 15b, all formed therein. In this case, the position of the gas inlets 15a is set to be essentially the same as that set by the chamber wall 3 (FIG. 2), so that only the gap L is adjusted without changing process conditions concerning gas supply.

FIG. 8 shows another embodiment used for processing a wafer W having a smaller diameter than that shown in FIG. 1. For example, the plasma processing apparatus 100 shown in FIG. 1 is set to process a wafer W having a diameter of 300 mm. On the other hand, the embodiment shown in FIG. 8 employs a smaller antenna unit 30a in place of the antenna unit 30 shown in FIG. 1, such that the apparatus 100 is set to process a wafer W having a smaller diameter of 200 mm.

The smaller antenna unit 30a having a smaller diameter is not compatible with the chamber wall 3 shown in FIG. 1. In this case, according to the conventional chamber structure, it is necessary to prepare another plasma processing apparatus for the process. On the other hand, according to this embodiment, the chamber wall 3 of the plasma processing apparatus 100 shown in FIG. 1 is replaced with a chamber wall 3b having a smaller inner diameter and a larger width. The chamber wall 3b is attached to the housing 2 such that the annular inner surface projects inward within the chamber to support the smaller antenna unit 30a.

Figure 9B:
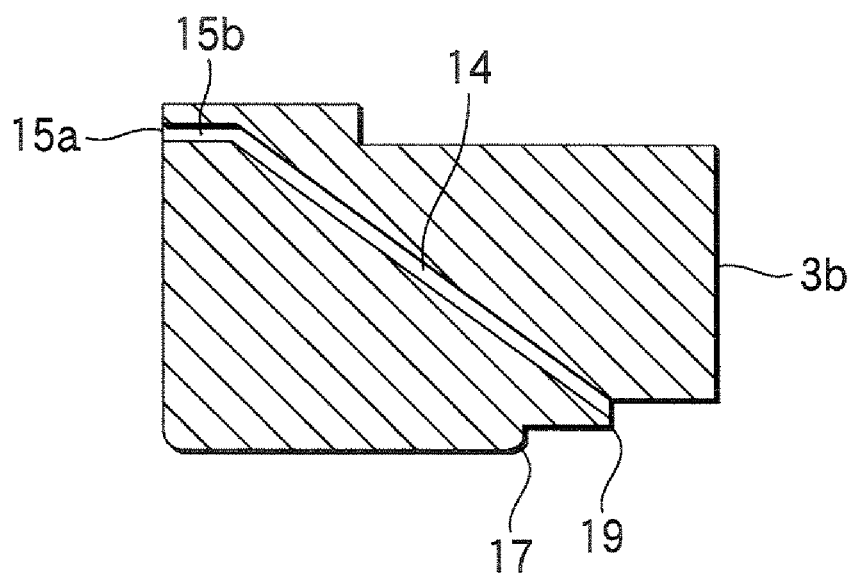
FIG. 9B This is a sectional view showing a main portion of the chamber wall used in the state shown in FIG. 8.

FIG. 9A is a perspective view showing the external appearance of the chamber wall 3b, and FIG. 9B is a sectional view thereof. The chamber wall 3b is formed as an annular ring having a larger width projecting inward. Accordingly, the outer peripheral portion of the lower surface of the chamber wall 3b is in contact with the housing 2, while the inner peripheral portion of the upper surface thereof is in contact with the smaller antenna unit 30a having a smaller inner diameter, thereby supporting the antenna unit 30a.

Further, the lower surface of the chamber wall 3b has a projecting portion 17 projecting downward to prevent plasma from directly acting on the seal member 9b.

According to this embodiment, the chamber wall 3b has essentially the same height as the chamber wall 3 shown in FIG. 1 to prevent the gap L from being changed, so that the same process can be performed under the same process conditions. If the objective process is different, the gap L can be adjusted by changing the height of the chamber wall 3b.

Further, the chamber wall 3b having a larger width is provided with gas passages 14 formed therein and extending slantwise from the annular passage 13 to gas inlets 15a facing the space inside the chamber. This structure minimizes the pressure loss due to a larger length of the gas passages 14 than that obtained by, e.g., the chamber wall 3 (FIG. 2), so that the gas flow can be smoothly supplied without retention. Further, the position of the gas inlets 15a is set to be essentially the same as that set by the chamber wall 3 (FIG. 2), so that only the size of the antenna unit is adjusted without changing process conditions concerning gas supply. Consequently, even if the size of the wafer W is changed, the same process conditions can be attained.

Figure 11B:
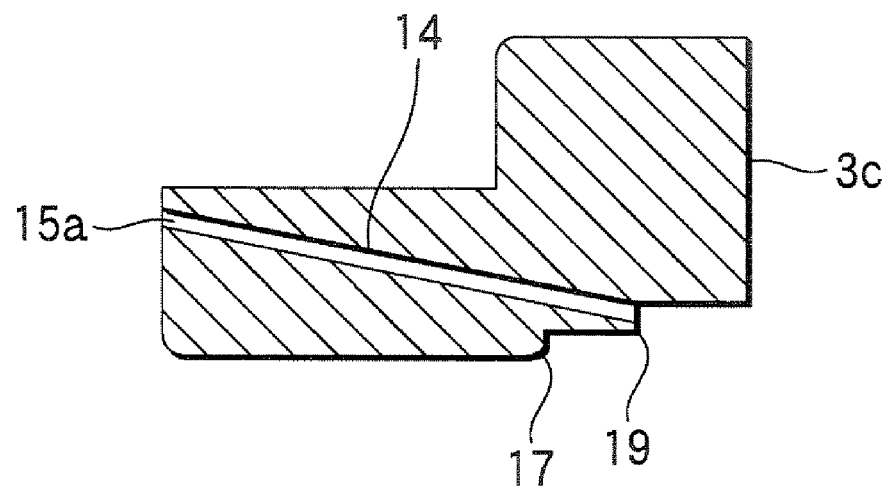
FIG. 11B This is a sectional view showing a main portion of the chamber wall used in the state shown in FIG. 10.

FIG. 10 shows another embodiment arranged to set the gap L to be smaller than that shown in FIG. 8. In this embodiment, the same smaller antenna unit 30a as shown in FIG. 8 is used along with a chamber wall 3c to decrease the gap L. FIG. 11A is a perspective view showing the external appearance of the chamber wall 3c, and FIG. 11B is a sectional view of a main portion thereof. The chamber wall 3c has a smaller height than the chamber wall 3b, and a step portion is formed on the upper side thereof between an annular peripheral portion and the inner side, so that the lower part of the step portion extending inward defines an L-shape in a cross section. The lower part of the step portion extending inward has a flat upper surface to form a support face. Accordingly, this support face extending inward can support the antenna unit 30a having a smaller diameter at a lower position, so that the gap L is flexibly adjusted. For example, where the height of the support face extending inward (or the height of the step portion) is smaller, the gap L becomes also smaller.

As described above, in the plasma processing apparatus 100 according to the present invention, the chamber wall 3 detachably disposed on the housing 2 can be replaced with one of the chamber walls 3a to 3c, so that the size of the antenna unit and/or the gap L are adjusted in accordance with the process object. In other words, each of the chamber walls 3, 3a, 3b, and 3c serves as an adapter to combine the housing 2 with each of the antenna units 30 and 30a having different sizes. Accordingly, an optimum plasma process can be performed in accordance with the size of a wafer W and/or the process content while minimizing a change in facilities.

The present invention has been described with reference to embodiments, but the present invention is not limited to the embodiments described above, and it may be modified in various manners.

For example, FIG. 1 shows the plasma processing apparatus 100 of the RLSA type, but the plasma processing apparatus may be of another type, such as the remote plasma type, ICP type, ECR type, surface reflection wave type, or magnetron type.

In the embodiments described above, the chamber 1 is divisible into two parts, i.e., the housing and chamber wall, but it may be structured to be divisible into three or more parts.

In the embodiments described above, the plasma processing apparatus 100 has the cylindrical chamber 1 for processing a semiconductor wafer formed of a circular plate. Alternatively, for example, a divisible structure according to the present invention may be applied to a plasma processing apparatus including a chamber having a rectangular shape in a horizontal cross section for processing a rectangular FPD glass substrate.

INDUSTRIAL APPLICABILITY

A plasma processing apparatus according to the present invention is preferably utilized in manufacturing various semiconductor devices.

The invention claimed is:

1. A plasma processing apparatus comprising:
   a process container configured to be vacuum-exhausted, the process container including a container casing that defines a surrounding sidewall with a top opening and a dielectric transmission plate supported by the container casing and airtightly closing the top opening;
   a worktable configured to place a target object thereon inside the process container;
   an antenna disposed above the transmission plate and configured to supply electromagnetic waves through the transmission plate into the process container; and
   a gas feed system configured to supply a plasma exciting gas into the process container,
   wherein the container casing includes
   an upper plate including an annular support portion formed thereon and extending inward such that the annular support portion defines the top opening and supports the transmission plate thereon,
   a first housing disposed below the upper plate and surrounding the worktable, and
   a second housing detachably interposed between the first housing and the upper plate and supporting the upper plate,
   such that an upper side of the second housing engages with a lower side of the upper plate at an upper interface, and a lower side of the second housing engages with an upper side of the first housing at a lower interface, which is present at a position in height between the workable and the transmission plate, to define the surrounding sidewall of the container casing in an airtight state,
   wherein the gas feed system includes
   a plurality of lower passages formed in the first housing and extending upward from a lower side of the first housing to the upper side of the first housing to supply the plasma exciting gas from a gas supply unit disposed outside the process container,
   a plurality of gas inlets opened directly below the upper plate to a space inside the process container and a plurality of upper passages extending upward from the lower side of the second housing to the gas inlets to supply the plasma exciting gas, the gas inlets and the upper passages being formed in the second housing at a plurality of positions, and
   a common annular passage formed by a combination of the first and second housing at the lower interface and connected to the lower passages and the upper passages to uniformly distribute the plasma exciting gas to the gas inlets, and,
   wherein a ring seal member is interposed between the first and second housing at an inward side relative to the common annular passage, and the second housing includes an annular projecting portion formed thereon at an inner lower end and extending downward, such that the projecting portion covers the lower interface from inside to prevent plasma generated inside the process container from directly acting on the ring seal member.

2. The plasma processing apparatus according to claim 1, wherein the common annular passage comprises a gap defined by a combination of between a step portion formed on an upper side of the first housing and a step portion formed on a lower side of the second housing.

3. The plasma processing apparatus according to claim 1, wherein the common annular passage includes a groove formed on at least one of an upper side of the first housing and a lower side of the second housing.

4. The plasma processing apparatus according to claim 1, wherein the second housing disposed in position has been selected, in accordance with a size of the target object, from a plurality of cylindrical members having at least one of different heights and inner diameters prepared in advance.

5. The plasma processing apparatus according to claim 1, wherein the antenna is a planar antenna having a plurality of slot holes formed therein to supply the electromagnetic waves.

6. The plasma processing apparatus according to claim 5, wherein the electromagnetic waves are microwaves.

* * * * *